(12) United States Patent
Park et al.

(10) Patent No.: US 8,736,518 B2
(45) Date of Patent: May 27, 2014

(54) DISPLAY APPARATUS

(75) Inventors: Jong-Woong Park, Yongin-si (KR);
Geun-Young Jeong, Busan (KR);
Ji-Yeon Yang, Cheonan-si (KR);
Won-Woo Jang, Busan (KR);
Joo-Hyung Lee, Gwacheon-si (KR)

(73) Assignee: Samsung Display Co., Ltd. (KR)

( * ) Notice: Subject to any disclaimer, the term of this patent is extended or adjusted under 35 U.S.C. 154(b) by 174 days.

(21) Appl. No.: 13/313,510

(22) Filed: Dec. 7, 2011

(65) Prior Publication Data

US 2013/0038513 A1    Feb. 14, 2013

(30) Foreign Application Priority Data

Aug. 9, 2011   (KR) .......................... 10-2011-0079127

(51) Int. Cl.
*G09G 3/20*    (2006.01)
(52) U.S. Cl.
USPC ............................. 345/55; 349/143; 349/146
(58) Field of Classification Search
None
See application file for complete search history.

(56) References Cited

U.S. PATENT DOCUMENTS

| | | | |
|---|---|---|---|
| 7,187,425 B2 * | 3/2007 | Yamazaki | 349/146 |
| 8,232,038 B2 * | 7/2012 | Hirakata et al. | 430/201 |
| 2002/0070909 A1 * | 6/2002 | Asano et al. | 345/76 |
| 2004/0246426 A1 * | 12/2004 | Wang et al. | 349/146 |
| 2005/0134175 A1 * | 6/2005 | Chen et al. | 313/582 |
| 2005/0236968 A1 * | 10/2005 | Gunner et al. | 313/500 |
| 2006/0033422 A1 * | 2/2006 | Chao et al. | 313/500 |
| 2007/0018911 A1 * | 1/2007 | Yim et al. | 345/60 |
| 2008/0158097 A1 * | 7/2008 | Guo | 345/55 |
| 2010/0110048 A1 * | 5/2010 | Min et al. | 345/204 |
| 2010/0127397 A1 * | 5/2010 | Chen et al. | 257/773 |
| 2011/0109658 A1 | 5/2011 | Park | |
| 2011/0260952 A1 * | 10/2011 | Hwang et al. | 345/55 |

FOREIGN PATENT DOCUMENTS

| | | |
|---|---|---|
| KR | 1020060008134 | 1/2006 |
| KR | 1020070019462 | 2/2007 |
| KR | 1020100113152 | 10/2010 |

* cited by examiner

*Primary Examiner* — Jason Olson
(74) *Attorney, Agent, or Firm* — Knobbe Martens Olson & Bear LLP

(57) ABSTRACT

A display apparatus includes a substrate and pixels defined on the substrate, where each of the pixels is a hexagon having a first side, a second side, a third side, a fourth side, a fifth side and a sixth side, and the sum of the length of the first side and the length of the fourth side is greater than half the sum of the lengths of the second, third, fifth and sixth sides.

23 Claims, 14 Drawing Sheets

DISPLAY APPARATUS

CROSS-REFERENCE TO RELATED APPLICATIONS

This application claims priority from Korean Patent Application No. 10-2011-0079127 filed on Aug. 9, 2011 in the Korean Intellectual Property Office, the disclosure of which is incorporated herein by reference in its entirety.

BACKGROUND

1. Field

The present disclosure relates to a display apparatus, and more particularly, to a display apparatus including a plurality of pixels.

2. Description of the Related Technology

Display apparatuses using organic light-emitting diodes (OLEDs) have many difficulties in achieving high resolution due to color patterning technology, backplane pixel compensation circuit technology, and the life of an electroluminescent (EL) material.

Recently, a lot of research has been conducted to realize high-resolution OLED display apparatuses. However, the current color patterning, backplane circuit compensation circuit, and EL material technologies have many limitations.

SUMMARY OF CERTAIN INVENTIVE ASPECTS

Aspects of the present disclosure provide a display apparatus which can increase the area of a backplane compensation circuit by reducing the number of pixels per dot, compared with an RGB stripe display apparatus, based on the Video Electronics Standards Association (VESA) standard.

Aspects of the present disclosure also provide a display apparatus which can increase an aperture ratio in the case of electroluminescent (EL) deposition.

Aspects of the present disclosure also provide a display apparatus which has an extended life by reducing the current density per area of EL.

Aspects of the present invention are not restricted to the ones set forth herein. The above and other aspects of the present invention will become more apparent to one of ordinary skill in the art to which the present invention pertains by referencing the detailed description given below.

According to one aspect, there is provided a display apparatus including a substrate and a plurality of pixels defined on the substrate, where each of the pixels is a hexagon including a first side, a second side, a third side, a fourth side, a fifth side and a sixth side in order, and the sum of the length of the first side and the length of the fourth side is greater than half the sum of the length of the second side, the length of the third side, the length of the fifth side, and the length of the sixth side.

According to another aspect, there is provided a display apparatus including a substrate and a plurality of pixels defined on the substrate, where the pixels are arranged in a matrix, wherein a $(k+1)^{th}$ row is shifted to the left or right by half a column from a $k^{th}$ row, a line that connects centers of gravity of two adjacent pixels in the $k^{th}$ row and lines that connect the centers of gravity of the two adjacent pixels in the $k^{th}$ row to a center of gravity at a shortest straight line distance from the line among centers of gravity of pixels in the $(k+1)^{th}$ row forms an isosceles triangle, and two sides of the isosceles triangle is longer than the other side.

BRIEF DESCRIPTION OF THE DRAWINGS

The above and other aspects and features will become more apparent by describing in detail certain embodiments with reference to the attached drawings, in which.

DETAILED DESCRIPTION OF CERTAIN INVENTIVE EMBODIMENTS

Figure 1:
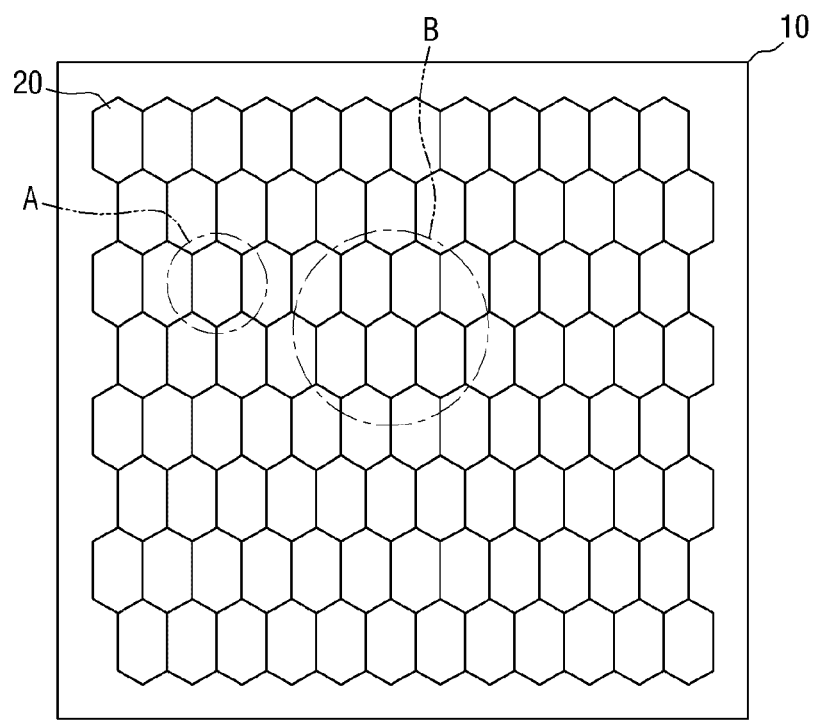
FIG. 1 is a top view of an embodiment of a display apparatus.

Advantages and features of the present invention may be understood more readily by reference to the following detailed description of certain embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers generally refer to like elements throughout. In the drawings, the thickness of layers and regions may be exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Figure 2:
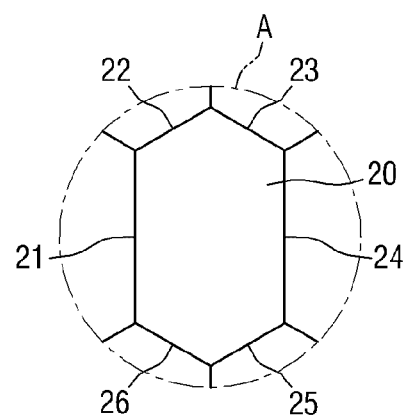
FIGS. 2 and 3 are enlarged views of region A shown in FIG. 1.
Figure 3:
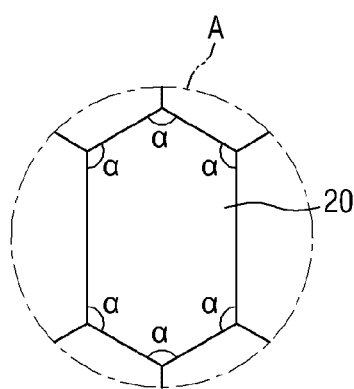
Figure 4:
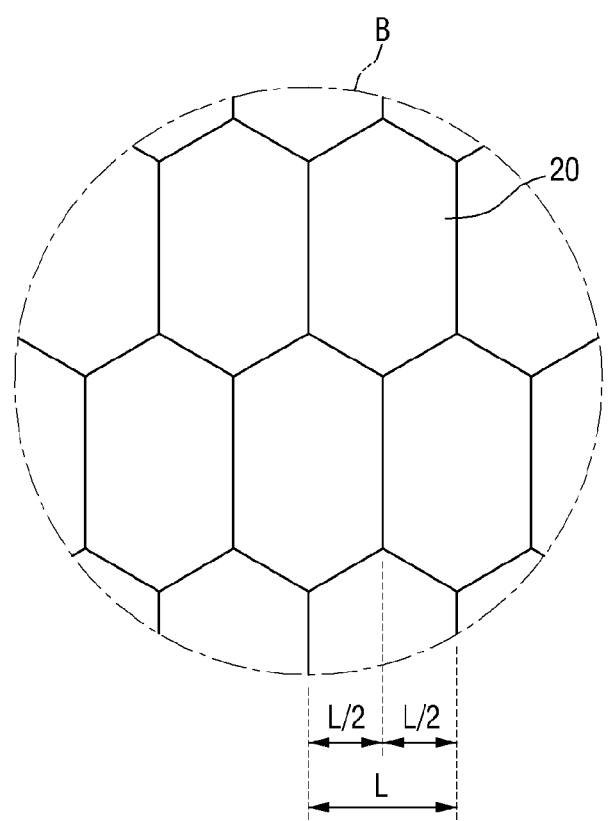
FIGS. 4 and 5 are enlarged views of region B shown in FIG. 1.
Figure 5:
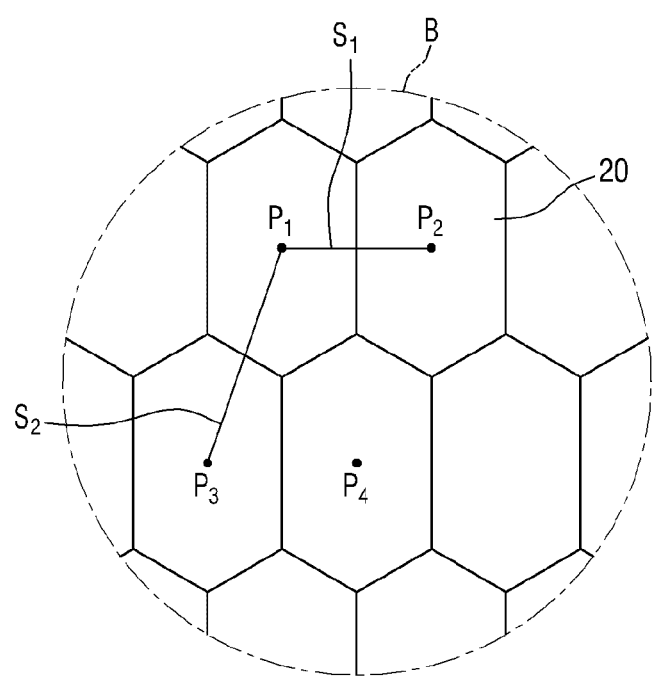

FIG. 1 is a top view of an embodiment of a display apparatus 100. FIGS. 2 and 3 are enlarged views of region A shown in FIG. 1. FIGS. 4 and 5 are enlarged views of region B shown in FIG. 1. Referring to FIGS. 1 and 2, the display apparatus 100 includes a substrate 10 and a plurality of pixels defined on the substrate 10.

The substrate 10 can be made of an insulating material such as, for example, glass or plastic. In some embodiments, the substrate 10 can be made of transparent glass.

One or more conductive material layers, and one or more insulating material layers can be formed on the substrate 10. Each of the conductive material layers can include various electrodes and wirings transmitting signals to the electrodes. The wirings can include a plurality of gate lines, a plurality of data lines, and pixel electrodes.

The gate lines can extend in a first direction of the substrate 10. For example, the gate lines can be formed on the substrate 10 to extend in a horizontal direction. Each of the gate lines can be a single layer made of metal, such as, for example, Ag or Al, or an alloy of these metals. In other embodiments, each of the gate lines can be a multilayer including the single layer and another layer made of a material having superior physical and electrical contact characteristics, such as, for example, Cr, Ti or Ta.

The data lines can extend in a second direction of the substrate 10. For example, the data lines can be formed on the substrate 10 to extend in a vertical direction. Each of the data lines can be a single layer made of metal, such as, for example, Ag or Al, or an alloy of these metals. In other embodiments, each of the data lines can be a multilayer including the single layer and another layer made of a material having superior physical and electrical contact characteristics, such as, for example, Cr, Ti or Ta. The data lines and the gate lines are formed on the substrate 10 to separate the pixels arranged in a matrix.

One or more switching devices can be formed on the substrate 10. In some embodiments, one or more thin-film transistors (TFT) connected to a gate line and a data line can be formed on the substrate 10. Each of the TFTs can correspond to one or more pixel electrodes and control the application of a voltage to the pixel electrodes.

The insulating material layers formed on the substrate 10 can include a gate insulating film, an interlayer insulating film, and/or a passivation film.

The above-described conductive material layers and the insulating material layers are appropriately arranged in each pixel 20 of the substrate 10 such that each pixel 20 can be driven independently. One pixel electrode can correspond to one pixel. The pixel electrodes will be described below with reference to FIG. 6.

The pixels 20 are defined on the substrate 10. Each of the pixels 20 can display one color. In some embodiments, the color displayed by each of the pixels 20 can be one of red, green and blue.

The pixels 20 can include a first color pixel, a second color pixel, and a third color pixel arranged alternately. Each of the first color pixel, the second color pixel and the third color pixel can display one color. In some embodiments, the first color pixel can display red, the second color pixel can display green, and the third color pixel can display blue. The first color pixel, the second color pixel, and the third color pixel can combine to form one dot.

Referring to FIG. 2, each of the pixels 20 is a hexagon having a first side 21, a second side 22, a third side 23, a fourth side 24, a fifth side 25, and a sixth side 26, in order. Each of the pixels 20 can be a hexagon formed by the first side 21, the second side 22, the third side 23, the fourth side 24, the fifth side 25 and the sixth side 26 connected sequentially in this order. In some embodiments, each of the pixels 20 can be a hexagon in which the sum of the length of the first side 21 and the length of the fourth side 24 is greater than half the sum of: the length of the second side 22, the length of the third side 23, the length of the fifth side 25, and the length of the sixth side 26.

In each of the pixels 20, the sum of the length of the first side 21 and the length of the fourth side 24 can be substantially equal to the sum of: the length of the second side 22, the length of the third side 23, the length of the fifth side 25, and the length of the sixth side 26. In some embodiments, the length of the second side 22, the length of the third side 23, the length of the fifth side 25 and the length of the sixth side 26 can be equal, and the length of the first side 21 and the length of the fourth side 24 can be equal. Each of the length of the first side 21 and the length of the fourth side 24 can be twice the length of the second side 22, the length of the third side 23, the length of the fifth side 25, and the length of the sixth side 26.

Referring to FIG. 3, internal angles of each hexagon (i.e., each pixel 20) can be equal. In some embodiments, the internal angles α of each hexagon can be approximately 120 degrees.

As described above, according to some embodiments, each of the pixels 20 can be hexagonal. The hexagonal pixels 20 can achieve a higher aperture ratio than rectangular pixels. Electroluminescent (EL) deposition using electroforming can further increase the aperture ratio.

According to some embodiments, the sum of the length of the first side 21 and the length of the fourth side 24 of each of the pixels 20 can be substantially equal to the sum of: the length of the second side 22, the length of the third side 23, the length of the fifth side 25, and the length of the sixth side 26. Each of the length of the first side 21 and the length of the fourth side 24 can be twice the length of the second side 22, the length of the third side 23, the length of the fifth side 25, and the length of the sixth side 26. Since the length of the first side 21 and the length of the fourth side 24 of each hexagon is twice the length of the second side 22, that is, since each regular hexagon is extended in the vertical direction, the number of pixels corresponding to each dot can be reduced. For example, the number of pixels can be reduced to 50% of the number of pixels in an RGB stripe pixel structure. Such a reduction in the number of pixels corresponding to one dot can increase the design area of a backplane pixel compensation circuit, cope with limitations of EL deposition technology, and provide a pixel structure contributing to the life of an EL material. Furthermore, despite the reduction in the number of pixels, the resolution standard set by the Video Electronics Standards Association (VESA) can still be satisfied.

Referring to FIGS. 1 and 4, the pixels 20 are arranged in a matrix, wherein a $(k+1)^{th}$ row can be shifted to the left or right by half a column from a $k^{th}$ row. Referring to FIG. 4, when a width of one column is L, pixels arranged in the $k^{th}$ row can be shifted to the left or right by L/2 from pixels arranged in the $(k+1)^{th}$ row. While a case where the $(k+1)^{th}$ row is shifted to the right by half a column from the $k^{th}$ row is illustrated in FIGS. 1 and 4 for ease of description, the $(k+1)^{th}$ row can also be shifted to the left by half a column from the $k^{th}$ row.

A pitch of each pixel 20 in a row direction denotes a distance between centers of gravity of two pixels adjacent to each other in the row direction, and a pitch of each pixel 20 in a column direction denotes a distance between centers of gravity of two pixels adjacent to each other in the column direction.

Referring to FIG. 5, the pitch of each pixel 20 in the column direction can be greater than the pitch of each pixel 20 in the row direction. In some embodiments, the pitch of each pixel 20 in the column direction can be twice the pitch of each pixel 20 in the row direction.

Referring to FIG. 5, the pitch of each pixel 20 in the row direction denotes a length of a straight line $S_1$ that connects centers $P_1$ and $P_2$ of gravity of two pixels adjacent to each other in the row direction, and the pitch of each pixel 20 in the column direction denotes a length of a straight line $S_2$ that connects centers $P_1$ and $P_3$ of gravity of two pixels adjacent to each other in the column direction. For ease of description, in FIG. 5, the pitch in the column direction is defined using a pixel whose center of gravity is $P_1$ and a center of gravity of a pixel located to the lower left from the above pixel. However, the pitch in the column direction can also be defined using the pixel whose center of gravity is $P_1$ and a center (i.e., $P_4$) of gravity of a pixel located to the lower right from the above pixel.

Figure 6:
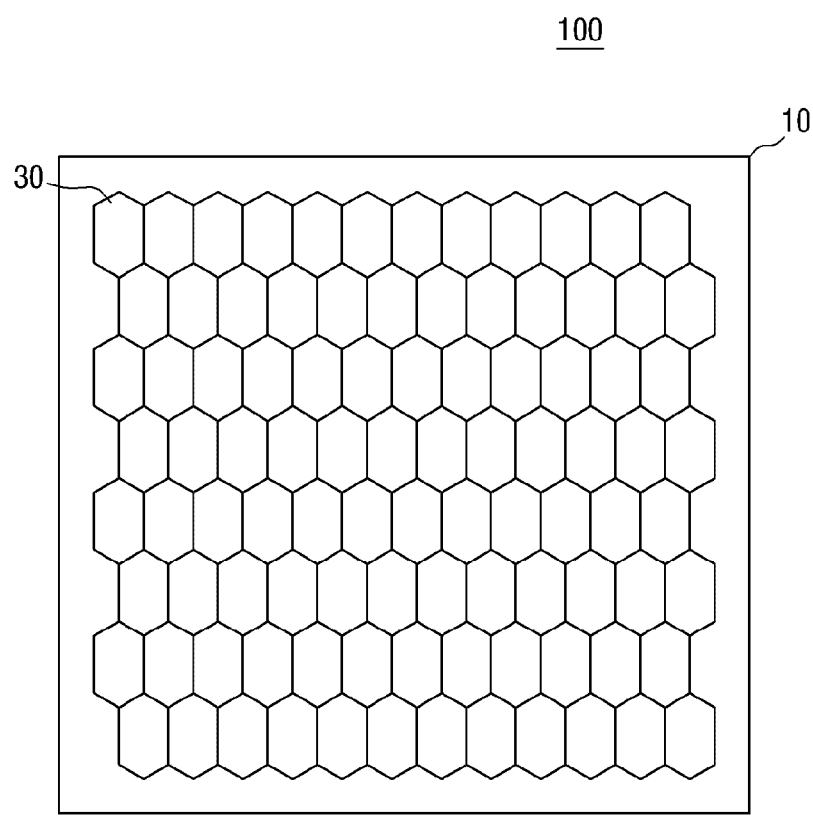
FIG. 6 is a top view of the display apparatus according to the embodiment of FIG. 1.

FIG. 6 is a top view of the display apparatus 100 according to the embodiment of FIG. 1. Referring to FIGS. 1 and 6, the display apparatus 100 can include the substrate 10, the pixels 20 defined on the substrate 10, and a plurality of pixel electrodes 30.

The above-described conductive material layers and the insulating material layers are appropriately arranged in each pixel 20 of the substrate 10 such that each pixel 20 can be driven independently. One pixel electrode can correspond to one pixel. However, the present invention is not limited thereto, and two or more pixel electrodes can correspond to one pixel.

The pixel electrodes 30 can have substantially the same shape as the pixels 20. For example, if the pixels 20 are hexagons, the pixel electrodes 30 can also be hexagons. In addition, the length of each side of each pixel electrode 30 can be equal to that of each side of each pixel 20.

FIGS. 7 through 10 are conceptual diagrams illustrating the operation of a rendering driver according to the embodiment of FIG. 1. The display apparatus 100 can include the rendering driver which drives the pixel electrodes 30.

The rendering driver can convert data on red, green and blue, which are signals generally input to a display apparatus, into data corresponding to a pixel structure. The rendering driver can convert a first data matrix of 2n rows and 2m columns into a second data matrix of 2n rows and m columns.

Figure 7:
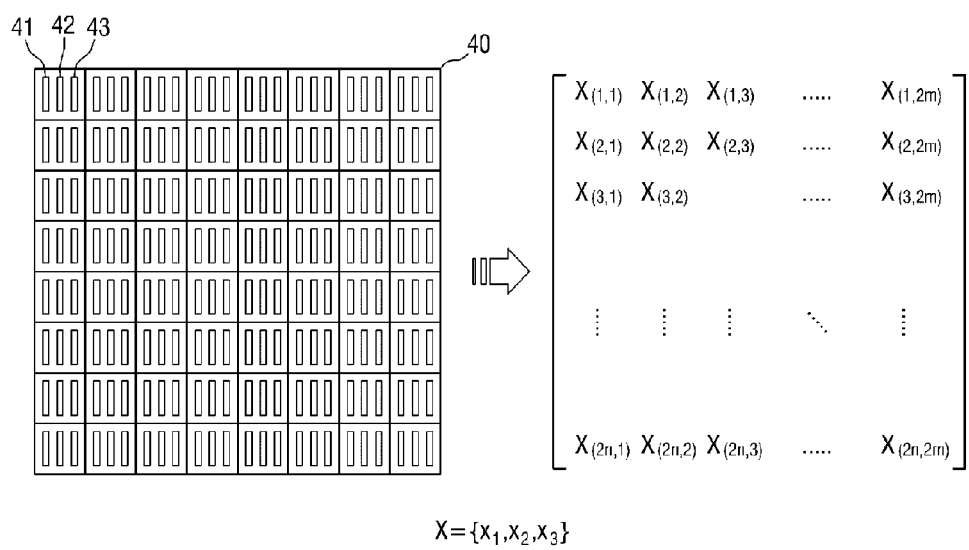
FIGS. 7 through 10 are conceptual diagrams illustrating the operation of a rendering driver according to the embodiment of FIG. 1.

Referring to FIG. 7, the rendering driver can use, as input data, the first data matrix of 2n rows and 2m columns. Generally, a display apparatus can receive RGB signals (i.e., a red value, a green value and a blue value) for displaying an image and can be driven as a conventional RGB stripe display apparatus. A display apparatus 40 shown on the left in FIG. 7 is a conventional RGB stripe display apparatus and can include a red pixel 41, a green pixel 42 and a blue pixel 43.

The first data matrix shown on the right in FIG. 7 can be a matrix of data used to realize a conventional RGB stripe display apparatus as the one shown on the left in FIG. 7. Each element of the first data matrix can include data on one red pixel, one green pixel and one blue pixel of the RGB stripe display apparatus. Each element of the first data matrix can include a first value $x_1$, a second value $x_2$, and a third value $x_3$, wherein the first value $x_1$ can be a red value for one red pixel, the second value $x_2$ can be a green value for one green pixel, and the third value $x_3$ can be a blue value for one blue pixel.

For ease of description, an element of the first data matrix can be indexed using a number of a row and a number of a column in which the element is located. For example, X(1,1) indicates an element located at an intersection of a first row and a first column in the first data matrix, and X(2n, 2m) indicates an element located at an intersection of a $(2n)^{th}$ row and a $(2m)^{th}$ column in the first data matrix.

One element of the first data matrix includes a red value for one red pixel 41, a green value for one green pixel 42, and a blue value for one blue pixel 43 in the display apparatus 40 shown on the left in FIG. 7. In addition, the position of one element of the first data matrix is the same as that of one red pixel 41, one green pixel 42, and one blue pixel 43 in the display apparatus 40. For example, X(1,1) in the first data matrix includes a red value of one red pixel 41, a green value of one green pixel 42, and a blue value of one blue pixel 43 at an intersection of a first row and a first column of the display apparatus 40, and X(2n, 2m) includes a red value of one red pixel, a green value of one green pixel, and a blue value of one blue pixel at an intersection of a $(2n)^{th}$ row and a $(2m)^{th}$ column of the display apparatus 40. Therefore, the number of rows and the number of columns in the display apparatus 40 can be equal to the number of rows and the number of columns in the first data matrix. Accordingly, data values for all pixels of the display apparatus 40 can be included in the first data matrix. For ease of description, the data values for the pixels of the display apparatus 40 are converted into a matrix. However, the data values for the pixels of the display apparatus 40 can also be converted into data in a form other than a matrix.

Figure 8:
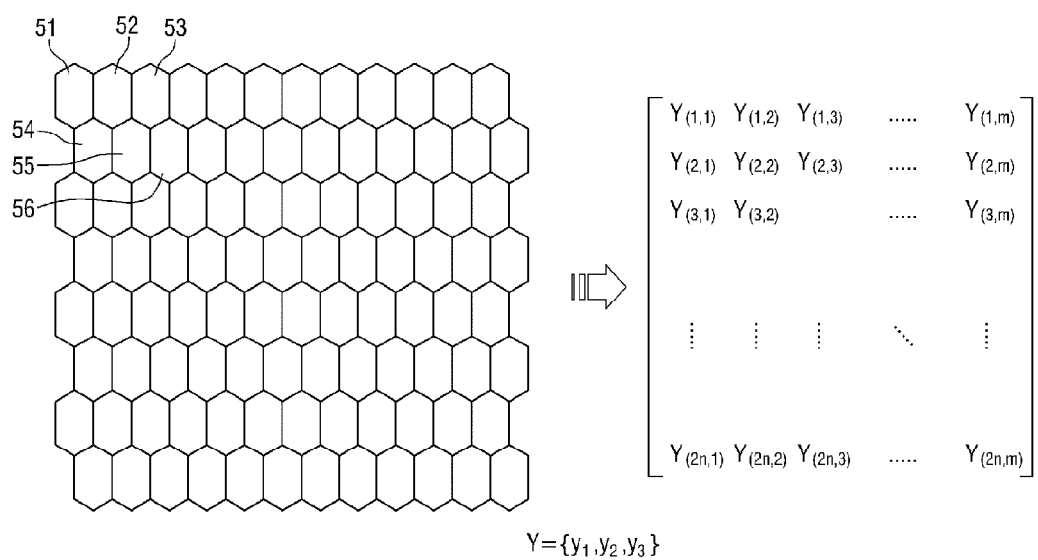

Referring to FIG. 8, the rendering driver can use, as output data, the second data matrix of 2n rows and m columns. The rendering driver can convert a red value, a green value and a blue value, which are input data of a conventional RGB stripe display apparatus, into data values corresponding to a pixel structure of the display apparatus 100 according to some embodiments. The data values can be output as the second data matrix.

A plurality of pixels shown on the left in FIG. 8 are structured in the same way as the pixels 20 shown in FIG. 1. The pixels can include a first color pixel, a second color pixel, and a third color pixel arranged alternately. In some embodiments, a red pixel 51, a blue pixel 52, and a green pixel 53 can be arranged alternately in a first row, and a green pixel 54, a red pixel 55, and a blue pixel 56 can be arranged alternately in a second row. In FIG. 8, a case where the pixels are arranged alternately in the above order is illustrated for ease of description. However, a red pixel, a green pixel and a blue pixel can be arranged alternately in this or any other order in the first row.

The second data matrix shown on the right in FIG. 8 can be a matrix of data used to realize the display apparatus 100 according to the embodiment of FIG. 1. Each element of the second data matrix can include data on one red pixel, one green pixel and one blue pixel of the display apparatus 100 according to the embodiment of FIG. 1. Each element of the second data matrix can include a first value $y_1$, a second value $y_2$, and a third value $y_3$, wherein the first value $y_1$ can be a red value for one red pixel, the second value $y_2$ can be a green value for one green pixel, and the third value $y_3$ can be a blue value for one blue pixel.

For ease of description, an element of the second data matrix can be indexed using a number of a row and a number of a column in which the element is located. For example, Y(1,1) indicates an element located at an intersection of a first row and a first column in the second data matrix, and Y(2n, m) indicates an element located at an intersection of a $(2n)^{th}$ row and a $m^{th}$ column in the second data matrix.

One element of the second data matrix includes a red value for one red pixel, a green value for one green pixel, and a blue value for one blue pixel in the display apparatus 100 shown on the left in FIG. 8. In addition, the position of one element of the second data matrix is the same as that of one red pixel, one green pixel, and one blue pixel in the display apparatus 100. For example, Y(1,1) in the second data matrix includes a red value of the first red pixel 51, a blue value of the blue pixel 52, and a green value of the green pixel 53 in a first row of the display apparatus 100, and Y(2, 1) includes a red value of the first red pixel 55, a blue value of the blue pixel 56, and a green value of the green pixel 54 in a second row of the display apparatus 100. For ease of description, data values for the pixels of the display apparatus 100 are converted into a matrix. However, the data values for the pixels of the display apparatus 100 can also be converted into data in a form other than a matrix.

Figure 9:
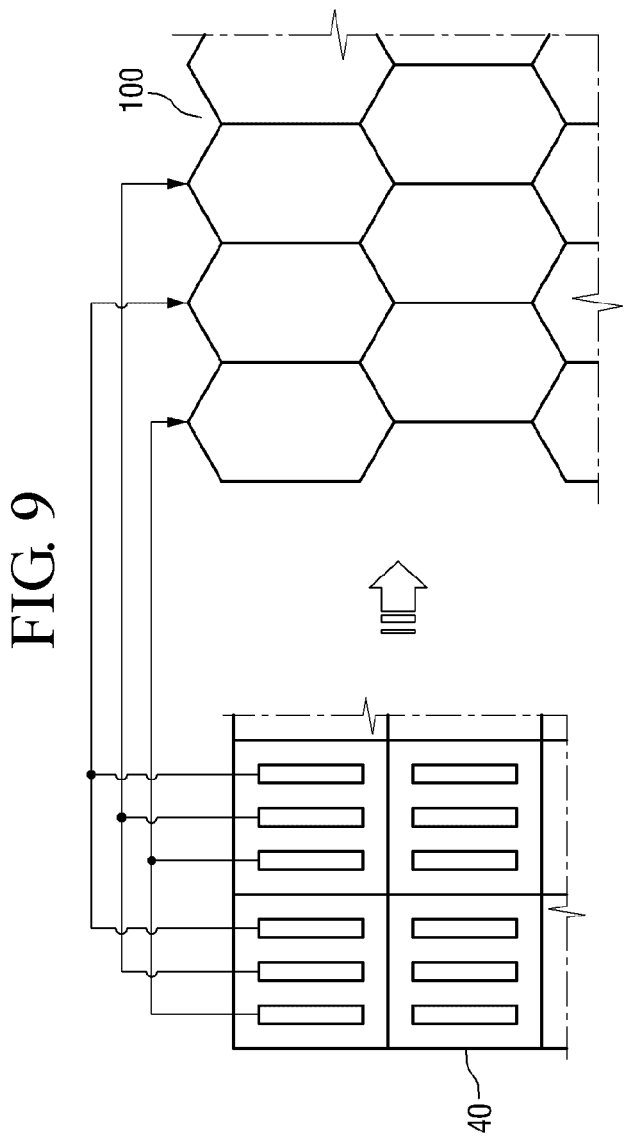

In FIG. 9, a rendering method used by the rendering driver according to the embodiment of FIG. 1 is illustrated. The rendering driver can set a mean value of a first value of (2i−1, j) of the first data matrix and a first value of (2i, j) of the first data matrix as a first value of (i, j) of the second data matrix, set a mean value of a second value of (2i−1, j) of the first data matrix and a second value of (2i, j) of the first data matrix as a third value of (i, j) of the second data matrix, and set a mean value of a third value of (2i−1, j) of the first data matrix and a third value of (2i, j) of the first data matrix as a second value of (i, j) of the second data matrix. Here, i is a positive integer equal to or less than m, and j is a positive integer equal to or less than 2n.

For ease of description, it is assumed that a red pixel, a green pixel and a blue pixel are arranged alternately in the display apparatus 40 shown on the left in FIG. 9 and that a red pixel, a blue pixel and a green pixel are arranged alternately in the display apparatus 100 shown on the right in FIG. 9.

More specifically, in the above-described rendering algorithm of the rendering driver, a mean value of a red value of a red pixel in a first row and a first column of the display apparatus 40 shown on the left in FIG. 9 and a red value of a red pixel in the first row and a second column of the display apparatus 40 is set as a red value of a first red pixel in a first row of the display apparatus 100 shown on the right in FIG. 9. That is, a mean value of a red value of an odd-numbered red pixel and a red value of an even-numbered red pixel in one row of the display apparatus 40 shown on the left in FIG. 9 is set as a red value of a red pixel in one row of the display apparatus 100 shown on the right in FIG. 9. In this way, red values of all red pixels of the display apparatus 40 shown on the left in FIG. 9 can be set as red values of all red pixels of the display apparatus 100 shown on the right in FIG. 9. The same rendering method as that for red pixels can be applied to green pixels and blue pixels. In some embodiments, the above-described rendering algorithm of the rendering driver can be used to render horizontal lines and diagonal lines.

As mentioned above, it is assumed, for ease of description, that a red pixel, a blue pixel and a green pixel are arranged alternately in the display apparatus 100 shown on the right in FIG. 9. However, the red pixel, the green pixel and the blue pixel can also be arranged alternately. Since red and green have good luminance characteristics, placing the red pixel and the green pixel to be adjacent to each other in the horizontal direction can be advantageous in expressing the luminance of horizontal components.

Using this pixel arrangement, the rendering driver can set the mean value of the first value of (2i−1, j) of the first data matrix and the first value of (2i, j) of the first data matrix as the first value of (i, j) of the second data matrix, set the mean value of the second value of (2i−1, j) of the first data matrix and the second value of (2i, j) of the first data matrix as the second value of (i, j) of the second data matrix, and set the mean value of the third value of (2i−1, j) of the first data matrix and the third value of (2i, j) of the first data matrix as the third value of (i, j) of the second data matrix. Here, i is a positive integer equal to or less than m, and j is a positive integer equal to or less than 2n.

Figure 10:
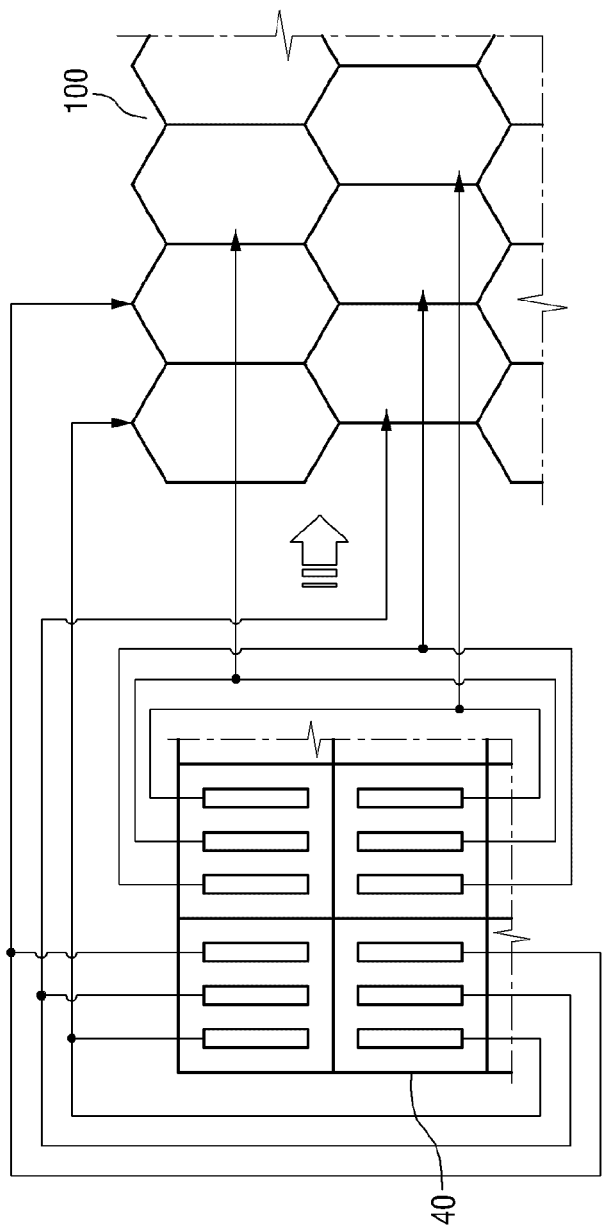

In FIG. 10, a rendering method used by the rendering driver according to the embodiment of FIG. 1 is illustrated. When rendering a vertical line, the rendering driver can set a mean value of a first value of (2a−1, 2b−1) of the first data matrix and a first value of (2a−1, 2b) of the first data matrix as a first value of (a, 2b−1) of the second data matrix, set a mean value of a second value of (2a−1, 2b−1) of the first data matrix and a second value of (2a−1, 2b) of the first data matrix as a first value of (a, 2b) of the second data matrix, set a mean value of a third value of (2a−1, 2b−1) of the first data matrix and a third value of (2a−1, 2b) of the first data matrix as a second value of (a, 2b−1) of the second data matrix, set a mean value of a first value of (2a, 2b−1) of the first data matrix and a first value of (2a, 2b) of the first data matrix as a second value of (a, 2b) of the second data matrix, set a mean value of a second value of (2a, 2b−1) of the first data matrix and a second value of (2a, 2b) of the first data matrix as a third value of (a, 2b−1) of the second data matrix, and set a mean value of a third value of (2a, 2b−1) of the first data matrix and a third value of (2a, 2b) of the first data matrix as a third value of (a, 2b) of the second data matrix. Here, a is a positive integer equal to or less than m, and b is a positive integer equal to or less than 2n.

For ease of description, it is assumed that a red pixel, a green pixel and a blue pixel are arranged alternately in the display apparatus 40 shown on the left in FIG. 10 and that a red pixel, a blue pixel and a green pixel are arranged alternately in each odd-numbered row while a green pixel, a red pixel and a blue pixel are arranged alternately in each even-numbered row in the display apparatus 100 shown on the right in FIG. 10.

More specifically, in the above-described rendering algorithm of the rendering driver, a mean value of a red value of a red pixel in a first row and a first column of the display apparatus 40 shown on the left in FIG. 10 and a red value of a red pixel in a second row and the first column of the display apparatus 40 is set as a red value of a first red pixel in a first row of the display apparatus 100 shown on the right in FIG. 10, and a mean value of a red value of a red pixel in the first row and a second column of the display apparatus 40 shown on the left in FIG. 10 and a red value of a red pixel in the second row and the second column of the display apparatus 40 is set as a red value of a first red pixel in a second row of the display apparatus 100 shown on the right in FIG. 10. In addition, a mean value of a green value of a green pixel in the first row and the first column of the display apparatus 40 shown on the left in FIG. 10 and a green value of a green pixel in the second row and the first column of the display apparatus 40 is set as a green value of a first green pixel in the second row of the display apparatus 100 shown on the right in FIG. 10, and a mean value of a green value of a green pixel in the first row and the second column of the display apparatus 40 shown on the left in FIG. 10 and a green value of a green pixel in the second row and the second column of the display apparatus 40 is set as a green value of a first green pixel in the first row of the display apparatus 100 shown on the right in FIG. 10. In addition, a mean value of a blue value of a blue pixel in the first row and the first column of the display apparatus 40 shown on the left in FIG. 10 and a blue value of a blue pixel in the second row and the first column of the display apparatus 40 is set as a blue value of a first blue pixel in the first row of the display apparatus 100 shown on the right in FIG. 10, and a mean value of a blue value of a blue pixel in the first row and the second column of the display apparatus 40 shown on the left in FIG. 10 and a blue value of a blue pixel in the second row and the second column of the display apparatus 40 is set as a blue value of a first blue pixel in the second row of the display apparatus 100 shown on the right in FIG. 10. By repeating the above process, the rendering driver can set values for all pixels of the display apparatus 40 shown on the left in FIG. 10 as values of all pixels of the display apparatus 100 shown on the right in FIG. 10.

As mentioned above, it is assumed, for ease of description, that a red pixel, a blue pixel and a green pixel are arranged alternately in the display apparatus 100 shown on the right in FIG. 10. However, the red pixel, the green pixel and the blue pixel can also be arranged alternately. Since red and green have good luminance characteristics, placing the red pixel and the green pixel to be adjacent to each other in the horizontal direction can be advantageous in expressing the luminance of horizontal components.

Using this pixel arrangement, the rendering driver can set the mean value of the first value of (2a−1, 2b−1) of the first data matrix and the first value of (2a−1, 2b) of the first data matrix as the first value of (a, 2b−1) of the second data matrix, set the mean value of the second value of (2a−1, 2b−1) of the first data matrix and the second value of (2a−1, 2b) of the first data matrix as the second value of (a, 2b) of the second data matrix, set the mean value of the third value of (2a−1, 2b−1) of the first data matrix and the third value of (2a−1, 2b) of the first data matrix as the first value of (a, 2b) of the second data matrix, set the mean value of the first value of (2a, 2b−1) of the first data matrix and the first value of (2a, 2b) of the first data matrix as the second value of (a, 2b) of the second data matrix, set the mean value of the second value of (2a, 2b−1) of the first data matrix and the second value of (2a, 2b) of the first data matrix as the third value of (a, 2b) of the second data matrix, and set the mean value of the third value of (2a, 2b−1) of the first data matrix and the third value of (2a, 2b) of the first data matrix as the third value of (a, 2b−1) of the second data matrix. Here, a is a positive integer equal to or less than m, and b is a positive integer equal to or less than 2n.

Figure 11:
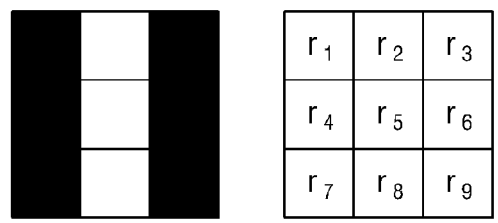
FIG. 11 is a conceptual diagram illustrating the operation of a determination unit according to the embodiment of FIG. 1.

FIG. 11 is a conceptual diagram illustrating the operation of a determination unit according to the embodiment of FIG. 1. The rendering driver can include the determination unit which determines whether a vertical line exists in an image to be displayed using a plurality of pixels. To determine whether a vertical line exists in an image to be displayed using a plurality of pixels, the determination unit can perform a convolution operation on a vertical line determination pattern and elements of the first data matrix.

A vertical line determination pattern shown on the left in FIG. 11 is formed by a black line and a white line arranged alternately. In FIG. 11, a vertical line determination pattern consisting of three rows and three columns is illustrated for ease of description. It is assumed that the vertical line determination pattern includes two black lines and one white line.

Input data shown on the right in FIG. 11 can include actually input red, green or blue values for red, green or blue pixels. In FIG. 11, an input image is split into nine regions arranged in three rows and three columns for ease of description. Each of the regions can include a red value for a red pixel, a green value for a green pixel, or a blue value for a blue pixel. In FIG. 11, only red values $r_1$ through $r_9$ for red pixels are displayed in the regions, respectively, for ease of description.

The determination unit of the rendering driver can perform a convolution operation on the vertical line determination pattern and the red values for the red pixels shown in FIG. 11 in order to determine whether a vertical line exists in an image to be displayed using a plurality of pixels. As a result of the convolution operation, the red values for the red pixels are converted into final pattern recognition values. The determination unit adds the final pattern recognition values on a column-by-column basis and determines whether the sum of the final pattern recognition values is equal to or greater than a predetermined threshold value. When the sum of the final pattern recognition values is equal to or greater than the predetermined threshold value, the determination unit determines that a vertical line exists. In FIG. 11, the above determination method is applied only to the red pixels for ease of description. However, the same method can also be applied to blue pixels and green pixels.

Figure 12:
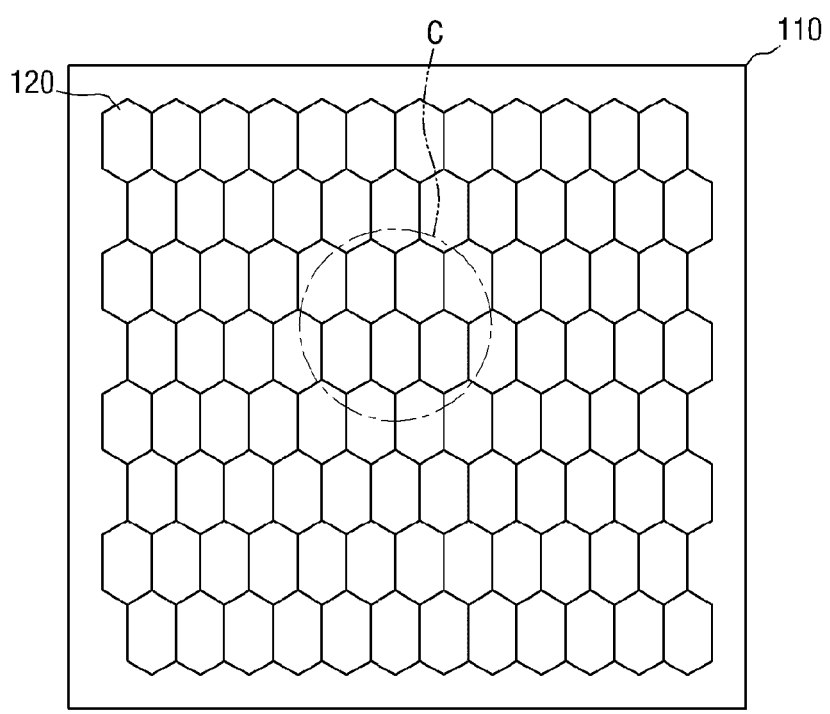
FIG. 12 is a top view of another embodiment of a display apparatus.
Figure 13:
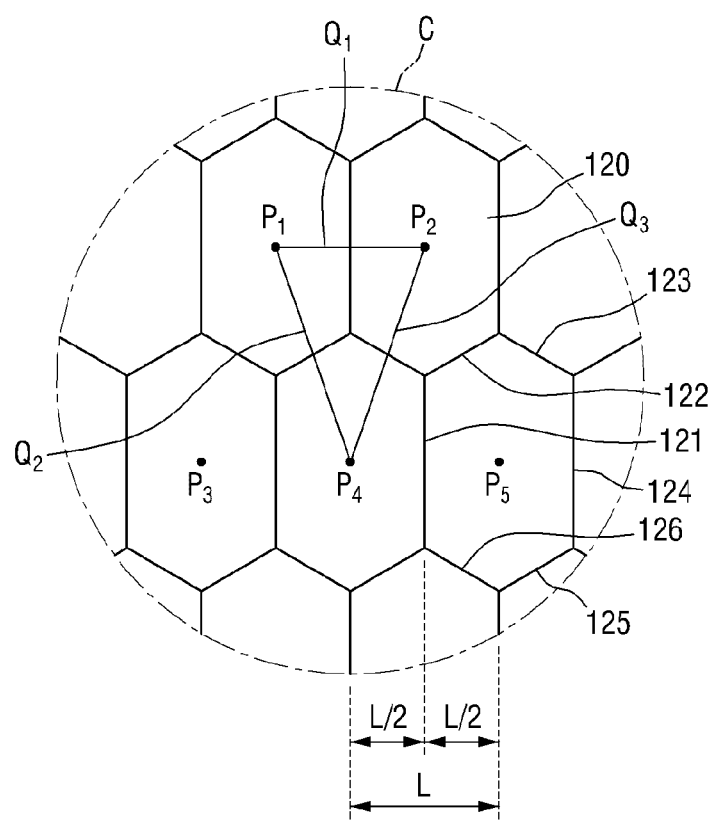
FIG. 13 is an enlarged view of region C shown in FIG. 12.

FIG. 12 is a top view of another embodiment of a display apparatus 200. FIG. 13 is an enlarged view of region C shown in FIG. 12. Referring to FIGS. 12 and 13, the display apparatus 200 includes a substrate 110 and a plurality of pixels 120 defined on the substrate 110. The substrate 110 is substantially the same as the substrate 10 of FIG. 1, and thus a repetitive description thereof will be omitted.

The pixels 120 are defined on the substrate 110. Each of the pixels 120 can display one color. In some embodiments, the color displayed by each of the pixels 120 can be one of red, green and blue.

Referring to FIGS. 12 and 13, each of the pixels 120 can be a hexagon having a first side 121, a second side 122, a third side 123, a fourth side 124, a fifth side 125, and a sixth side 126. In some embodiments, each of the pixels 120 can be a hexagon in which the sum of the length of the first side 121 and the length of the fourth side 124 is greater than half the sum of: the length of the second side 122, the length of the third side 123, the length of the fifth side 125 and the length of the sixth side 126. The hexagonal pixels 120 can achieve a higher aperture ratio than rectangular pixels, and EL deposition using electroforming can further increase the aperture ratio.

Referring to FIG. 13, the pixels 120 are arranged in a matrix, wherein a $(k+1)^{th}$ row can be shifted to the left or right by half a column from a $k^{th}$ row. Referring to FIG. 13, when a width of one column is L, pixels arranged in the $k^{th}$ row can be shifted to the left or right by L/2 from pixels arranged in the $(k+1)^{th}$ row. While a case where the $(k+1)^{th}$ row is shifted to the right by half a column from the $k^{th}$ row is illustrated in FIGS. 12 and 13 for ease of description, the $(k+1)^{th}$ row can also be shifted to the left by half a column from the $k^{th}$ row.

Referring to FIG. 13, a line that connects centers of gravity of two adjacent pixels in the $k^{th}$ row and lines that connect the centers of gravity of the two adjacent pixels in the $k^{th}$ row to a center of gravity at a shortest straight line distance from the above line among centers of gravity of the pixels in the $(k+1)^{th}$ row can form an isosceles triangle, and two sides of the isosceles triangle can be longer than the other side.

More specifically, a line $Q_1$ that connects centers $P_1$ and $P_2$ of gravity of two adjacent pixels in the $k^{th}$ row and lines that connect the centers $P_1$ and $P_2$ of gravity of the two adjacent pixels in the $k^{th}$ row to a center $P_4$ of gravity at a shortest straight line distance from the above line $Q_1$ among centers $P_3$ through $P_5$ of gravity of the pixels in the $(k+1)^{th}$ row can form an isosceles triangle, and two sides $Q_2$ and $Q_3$ of the isosceles triangle can be longer than the other side $Q_1$.

Figure 14:
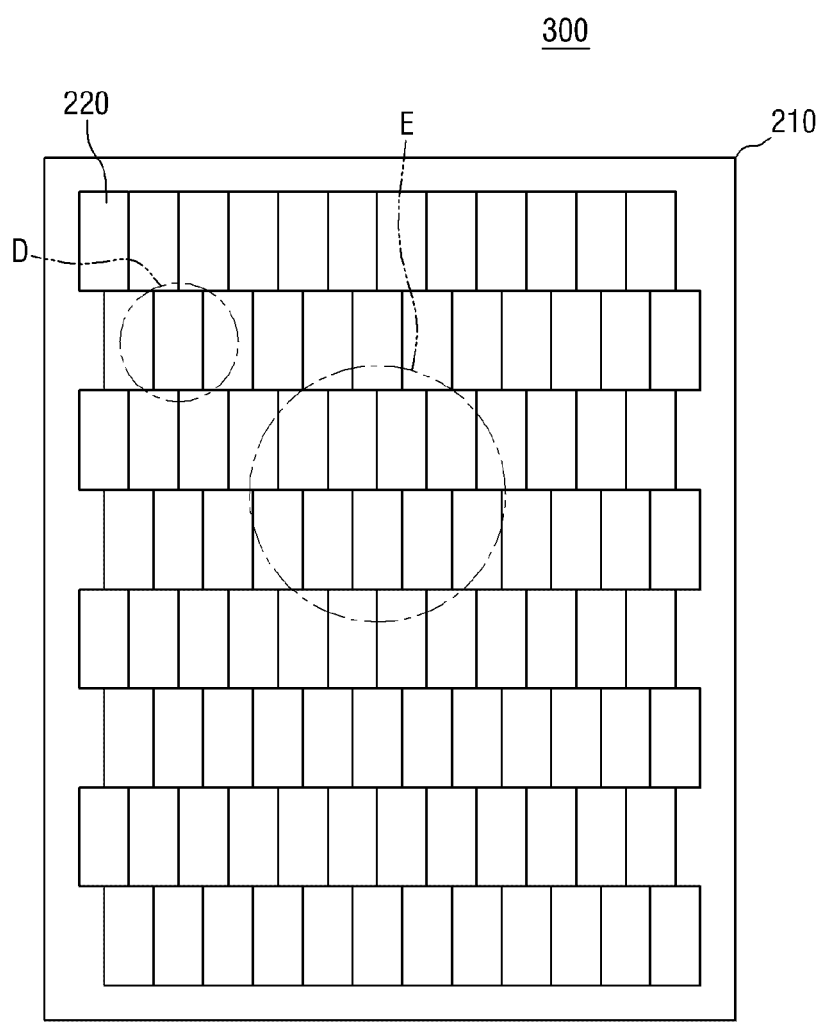
FIG. 14 is a top view of another embodiment of a display apparatus.
Figure 15:
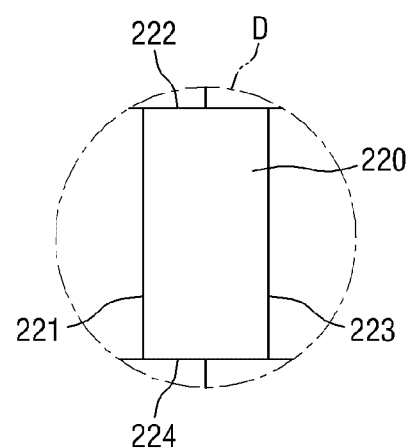
FIG. 15 is an enlarged view of region D shown in FIG. 14.
Figure 16:
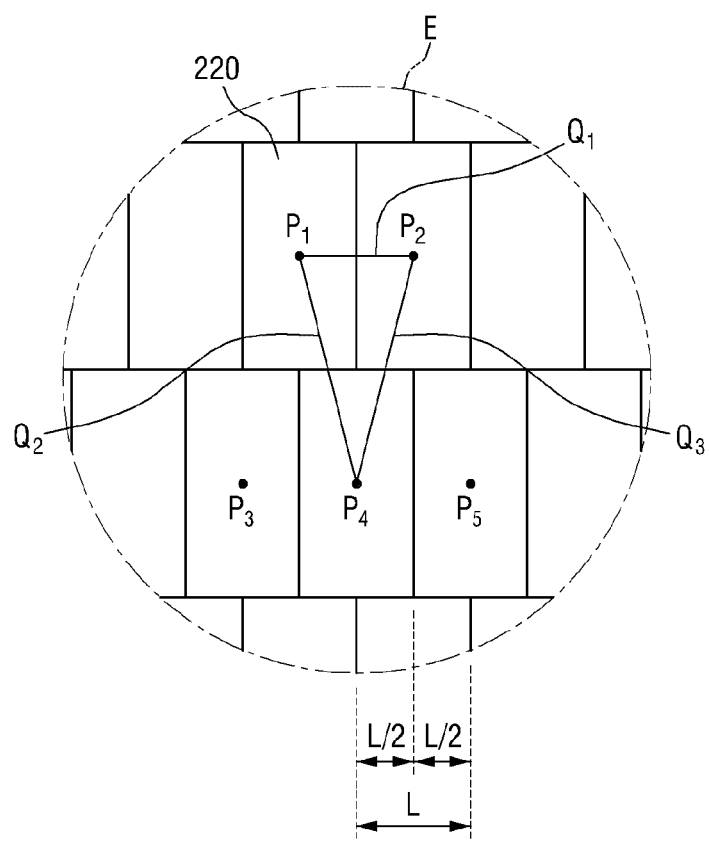
FIG. 16 is an enlarged view of region E shown in FIG. 14.

FIG. 14 is a top view of another embodiment of a display apparatus 300. FIG. 15 is an enlarged view of region D shown in FIG. 14. FIG. 16 is an enlarged view of region E shown in FIG. 14. Referring to FIGS. 14 through 16, the display apparatus 300 includes a substrate 210 and a plurality of pixels 220 defined on the substrate 210. The substrate 210 is substantially the same as the substrate 10 of FIG. 1, and thus a repetitive description thereof will be omitted.

The pixels 220 are defined on the substrate 210. Each of the pixels 220 can display one color. In some embodiments, the color displayed by each of the pixels 220 can be one of red, green and blue.

Referring to FIGS. 14 through 16, each of the pixels 220 can be a quadrilateral, such as a square or a rectangle, having a first side 221, a second side 222, a third side 223, and a fourth side 224, shown in order. Each of these sides has a defined length Referring to FIG. 15, the length of the first side 221 of each of the pixels 220 is substantially equal to that of the third side 223. The first side 221 and the third side 223 can face each other and can be substantially parallel to each other. In addition, the sum of the length of the first side 221 and the length of the third side 223 can be substantially twice the sum of the length of the second side 222 and the length of the fourth side 224.

Referring to FIG. 16, the pixels 220 are arranged in a matrix, wherein a $(k+1)^{th}$ row can be shifted to the left or right by half a column from a $k^{th}$ row. Referring to FIG. 16, when a width of one column is L, pixels arranged in the $k^{th}$ row can be shifted to the left or right by L/2 from pixels arranged in the $(k+1)^{th}$ row. While a case where the $(k+1)^{th}$ row is shifted to the right by half a column from the $k^{th}$ row is illustrated in FIGS. 14 through 16 for ease of description, the $(k+1)^{th}$ row can also be shifted to the left by half a column from the $k^{th}$ row.

Referring to FIG. 16, a line that connects centers of gravity of two adjacent pixels in the $k^{th}$ row and lines that connect the centers of gravity of the two adjacent pixels in the $k^{th}$ row to a center of gravity at a shortest straight line distance from the above line among centers of gravity of the pixels in the $(k+1)^{th}$ row can form an isosceles triangle, and two sides of the isosceles triangle can be longer than the other side.

More specifically, a line $Q_1$ that connects centers $P_1$ and $P_2$ of gravity of two adjacent pixels in the $k^{th}$ row and lines that connect the centers $P_1$ and $P_2$ of gravity of the two adjacent pixels in the $k^{th}$ row to a center $P_4$ of gravity at a shortest straight line distance from the above line $Q_1$ among centers $P_3$ through $P_5$ of gravity of the pixels in the $(k+1)^{th}$ row can form an isosceles triangle, and two sides $Q_2$ and $Q_3$ of the isosceles triangle can be longer than the other side $Q_1$.

Embodiments of the present invention provide at least one of the following advantages.

A display apparatus according to embodiments of the present invention can increase the area of a backplane compensation circuit by reducing the number of pixels per dot, compared with an RGB stripe display apparatus, based on the VESA standard, increase an aperture ratio in the case of EL deposition, and extend its life by reducing the current density per area of EL.

However, the effects of the present invention are not restricted to the one set forth herein. The above and other effects of the present invention will become more apparent by referencing the claims.

What is claimed is:

1. A display apparatus comprising:
   a substrate;
   a plurality of pixels defined on the substrate;
   a plurality of pixel electrodes formed on the substrate, wherein the pixel electrodes correspond respectively to the pixels and have substantially the same shape as the pixels; and
   a rendering driver driving the pixel electrodes and converting a first data matrix of 2n rows and 2m columns into a second data matrix of 2n rows and m columns, wherein each element of the first data matrix and the second data matrix comprises a first value, a second value and a third value, and the first value, the second value and the third value correspond respectively to the first color pixel, the second color pixel and the third color pixel arranged alternately, among the plurality of pixels,
   wherein each of the pixels is a hexagon comprising in order a first side, a second side, a third side, a fourth side, a fifth side and a sixth side, each of said sides having a defined length, and wherein the sum of the length of the first side and the length of the fourth side is greater than half the sum of the length of the second side, the length of the third side, the length of the fifth side, and the length of the sixth side.

2. The display apparatus of claim 1, wherein the length of the first side and the length of the fourth side are substantially equal.

3. The display apparatus of claim 1, wherein the first side and the fourth side face each other and are substantially parallel to each other.

4. The display apparatus of claim 1, wherein the sum of the length of the first side and the length of the fourth side is substantially equal to the sum of: the length of the second side, the length of the third side, the length of the fifth side, and the length of the sixth side.

5. The display apparatus of claim 1, wherein internal angles of the hexagon are substantially equal.

6. The display apparatus of claim 1, wherein the pixels are arranged in a matrix, wherein a (k+1)th row is shifted to the left or right by half a column from a kth row.

7. The display apparatus of claim 6, wherein a pitch of each pixel in a column direction is greater than a pitch of each pixel in a row direction.

8. The display apparatus of claim 7, wherein the pitch of each pixel in the column direction is twice the pitch of each pixel in the row direction.

9. The display apparatus of claim 1, wherein the pixels comprise a first color pixel, a second color pixel, and a third color pixel arranged alternately.

10. The display apparatus of claim 1, wherein the rendering driver sets a mean value of a first value of a (2i−1, j) element of the first data matrix and a first value of a (2i, j) element of the first data matrix as a first value of a (i, j) element of the second data matrix, sets a mean value of a second value of the (2i−1, j) element of the first data matrix and a second value of the (2i, j) element of the first data matrix as a third value of the (i, j) element of the second data matrix, and sets a mean value of a third value of the (2i−1, j) element of the first data matrix and a third value of the (2i, j) element of the first data matrix as a second value of the (i, j) element of the second data matrix, where i is a positive integer equal to or less than m, and j is a positive integer equal to or less than 2n.

11. The display apparatus of claim 10, wherein when rendering a vertical line, the rendering driver sets a mean value of a first value of a (2a−1, 2b−1) element of the first data matrix and a first value of a (2a−1, 2b) element of the first data matrix as a first value of a (a, 2b−1) element of the second data matrix, sets a mean value of a second value of the (2a−1, 2b−1) element of the first data matrix and a second value of the (2a−1, 2b) element of the first data matrix as a first value of a (a, 2b) element of the second data matrix, sets a mean value of a third value of the (2a−1, 2b−1) element of the first data matrix and a third value of the (2a−1, 2b) element of the first data matrix as a second value of the (a, 2b−1) element of the second data matrix, sets a mean value of a first value of a (2a, 2b−1) element of the first data matrix and a first value of a (2a, 2b) element of the first data matrix as a second value of the (a, 2b) element of the second data matrix, sets a mean value of a second value of the (2a, 2b−1) element of the first data matrix and a second value of the (2a, 2b) element of the first data matrix as a third value of the (a, 2b−1) element of the second data matrix, and sets a mean value of a third value of the (2a, 2b−1) element of the first data matrix and a third value of the (2a, 2b) element of the first data matrix as a third value of the (a, 2b) element of the second data matrix, where a is a positive integer equal to or less than m, and b is a positive integer equal to or less than 2n.

12. The display apparatus of claim 1, wherein the rendering driver sets the mean value of the first value of the (2i−1, j) element of the first data matrix and the first value of the (2i, j) element of the first data matrix as the first value of the (i, j) element of the second data matrix, sets the mean value of the second value of the (2i−1, j) element of the first data matrix and the second value of the (2i, j) element of the first data matrix as the second value of the (i, j) element of the second data matrix, and sets the mean value of the third value of the (2i−1, j) element of the first data matrix and the third value of the (2i, j) element of the first data matrix as the third value of the (i, j) element of the second data matrix, where i is a positive integer equal to or less than m, and j is a positive integer equal to or less than 2n.

13. The display apparatus of claim 12, wherein when rendering a vertical line, the rendering driver sets the mean value of the first value of the (2a−1, 2b−1) element of the first data matrix and the first value of the (2a−1, 2b) element of the first data matrix as the first value of the (a, 2b−1) element of the second data matrix, sets the mean value of the second value of the (2a−1, 2b−1) element of the first data matrix and the second value of the (2a−1, 2b) element of the first data matrix as the second value of the (a, 2b−1) element of the second data matrix, sets the mean value of the third value of the (2a−1, 2b−1) element of the first data matrix and the third value of the (2a−1, 2b) element of the first data matrix as the first value of the (a, 2b) element of the second data matrix, sets the mean value of the first value of the (2a, 2b−1) element of the first data matrix and the first value of the (2a, 2b) element of the first data matrix as the second value of the (a, 2b) element of the second data matrix, sets the mean value of the second value of the (2a, 2b−1) element of the first data matrix and the second value of the (2a, 2b) element of the first data matrix as the third value of the (a, 2b) element of the second data matrix, and sets the mean value of the third value of the (2a, 2b−1) element of the first data matrix and the third value of the (2a, 2b) element of the first data matrix as the third value of the (a, 2b−1) element of the second data matrix, where a is a positive integer equal to or less than m, and b is a positive integer equal to or less than 2n.

14. The display apparatus of claim 1, wherein the rendering driver comprises a determination unit which determines whether a vertical line exists in an image to be displayed using the pixels.

15. The display apparatus of claim 14, wherein the determination unit performs a convolution operation on a vertical line determination pattern and the elements of the first data matrix.

16. A display apparatus comprising:
a substrate; and
a plurality of pixels defined on the substrate;
a plurality of pixel electrodes formed on the substrate, wherein the pixel electrodes correspond respectively to the pixels and have substantially the same shape as the pixels; and
a rendering driver driving the pixel electrodes and converting a first data matrix of 2n rows and 2m columns into a second data matrix of 2n rows and m columns, wherein each element of the first data matrix and the second data matrix comprises a first value, a second value and a third value, and the first value, the second value and the third value correspond respectively to the first color pixel, the second color pixel and the third color pixel arranged alternately, among the plurality of pixels,
wherein the pixels are arranged in a matrix, wherein a (k+1)th row is shifted to the left or right by half a column from a kth row, wherein a line that connects centers of gravity of two adjacent pixels in the kth row and lines that connect the centers of gravity of the two adjacent pixels in the kth row to a center of gravity at a shortest straight line distance from the line among centers of gravity of pixels in the (k+1)th row forms an isosceles triangle, and wherein two sides of the isosceles triangle is longer than the other side.

17. The display apparatus of claim 16, wherein each of the pixels is a hexagon comprising in order a first side, a second side, a third side, a fourth side, a fifth side and a sixth side, each of said sides having a defined length, and wherein the sum of the length of the first side and the length of the fourth side is greater than half the sum of: the length of the second side, the length of the third side, the length of the fifth side, and the length of the sixth side.

18. The display apparatus of claim 17, wherein the length of the first side and the length of the fourth side are substantially equal, and the first side and the fourth side face each other and are substantially parallel to each other.

19. The display apparatus of claim 17, wherein the sum of the length of the first side and the length of the fourth side is substantially equal to the sum of: the length of the second side, the length of the third side, the length of the fifth side, and the length of the sixth side.

20. The display apparatus of claim 17, wherein a pitch of each pixel in a column direction is twice a pitch of each pixel in a row direction.

21. The display apparatus of claim 16, wherein each of the pixels is a quadrilateral comprising in order a first side, a second side, a third side, and a fourth side, each of said sides having a defined length.

22. The display apparatus of claim 21, wherein the length of the first side and the length of the third side are substantially equal, and the first side and the third side face each other and are substantially parallel to each other.

23. The display apparatus of claim 21, wherein the sum of the length of the first side and the length of the third side is substantially equal to twice the sum of the length of the second side and the length of the fourth side.

* * * * *